United States Patent
Furasawa

(12) 
(10) Patent No.: US 6,262,586 B1
(45) Date of Patent: Jul. 17, 2001

(54) PROBING METHOD AND APPARATUS UTILIZING AN OPTIMAL PROBING MODE

(75) Inventor: Yukihiko Furasawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 08/926,145

(22) Filed: Sep. 9, 1997

(30) Foreign Application Priority Data

Sep. 20, 1996 (JP) .................................................. 8-250249

(51) Int. Cl.⁷ .................................................. G01R 31/26
(52) U.S. Cl. ......................... 324/765; 324/754; 324/758
(58) Field of Search ................................. 324/754, 765, 324/72.5, 758, 761, 762; 439/482

(56) References Cited

U.S. PATENT DOCUMENTS

| | | | |
|---|---|---|---|
| 3,741,022 | * 6/1973 | Olson et al. | 324/158 |
| 4,786,867 | * 11/1988 | Yamatsu | 324/758 |
| 4,965,515 | * 10/1990 | Karasawa | 324/759 |
| 5,479,108 | * 12/1995 | Cheng | 324/765 |
| 5,532,609 | * 7/1996 | Harwood et al. | 324/754 |
| 5,585,737 | 12/1996 | Shibata | 324/754 |
| 5,631,856 | * 5/1997 | Keller et al. | 324/758 |

FOREIGN PATENT DOCUMENTS

| | | |
|---|---|---|
| 7-235572 | 9/1995 | (JP) . |
| 7-321167 | 12/1995 | (JP) . |
| 8-037213 | 2/1996 | (JP) . |

* cited by examiner

Primary Examiner—Safet Metjahic
Assistant Examiner—Minh Tang
(74) Attorney, Agent, or Firm—Morrison & Foerster

(57) ABSTRACT

It is an object of the present invention to provide an optimal probing mode setting method by which the probing area is set by a prober only within the position, of a semiconductor wafer, in which electrode pads are formed, thereby making the protection of the probes possible. According to the present invention, in an inspection mechanism of a multi-type in which a probe card having one set of measuring channels is moved every plural chips out of a plurality of chips which are formed in a matrix on a wafer in order to carry out the inspection, the probe card is moved successively in a mode in which all the channels of the one set of measuring channels are necessarily located in the positions where the respective chips will be measured, whereby it is prevented that the probe is made enter into a tapered face in the end portion of the semiconductor wafer to be damaged.

11 Claims, 3 Drawing Sheets

| STEP NUMBER | COORDINATES OF CHANNEL 1 | | ON-WAFER INFORMATION 1=ON, 0=OFF | | | |
|---|---|---|---|---|---|---|
| | Xn | Yn | CH1 | CH2 | CH3 | CH4 |
| 1 | 2 | 6 | 0 | 1 | 1 | 1 |
| 2 | 3 | 6 | 1 | 1 | 1 | 1 |
| 3 | 4 | 6 | 0 | 0 | 0 | 1 |
| 4 | 5 | 6 | 0 | 0 | 1 | 1 |
| 5 | 5 | 7 | 0 | 0 | 0 | 1 |
| 6 | 6 | 7 | 0 | 0 | 1 | 1 |
| 7 | 6 | 8 | 0 | 0 | 0 | 1 |
| 8 | 7 | 8 | 0 | 0 | 1 | 1 |
| 9 | 7 | 9 | 0 | 0 | 0 | 1 |
| 10 | 7 | 10 | 1 | 1 | 1 | 1 |
| 11 | 7 | 11 | 0 | 1 | 1 | 1 |
| 12 | 6 | 11 | 1 | 1 | 1 | 1 |
| | | | | | | |
| n | | | | | | |

USER INPUT TABLE (WITHIN SOLID LINE)

FIG. 3

PROBING METHOD AND APPARATUS UTILIZING AN OPTIMAL PROBING MODE

BACKGROUND OF THE INVENTION

The present invention relates to a probing method and apparatus utilizing an optimal probing mode in a prober for inspecting to see whether each of chips formed on a semiconductor wafer is good or bad.

In general, in the process of manufacturing a semiconductor product, a large number of chips are formed so as to be arranged in good order on one sheet of semiconductor wafer. All of these chips are not necessarily a non-defective. Therefore, when the process proceeds to the stage near the final stage, before the semiconductor wafer is cut to produce a plurality of chips, the electrical characteristics of each of the chips are measured with the state of the semiconductor wafer held in order to inspect to see whether each of the chips is a non-defective or a defective.

This measurement is carried out generally using a prober. This prober is provided with a probe card having a large number of probes which are made come in contact with the electrode pads which the individual chips on the semiconductor wafer have. A predetermined inspection signal is applied from the probes to the electrode pads of the individual chips in order to measure the electrical characteristics of the individual chips.

As for a measurement mechanism for such a probe card, there is known the mechanism which has only one measuring channel for use in measuring the electrical characteristics of one chip in order to measure the electrical characteristics of each of the chips one by one in turn. On the other hand, as for a measurement mechanism of the probe card, there is also well known an instrumentation mechanism of a multi-type. The instrumentation mechanism of a multi-type includes one set of measuring channels consisting of a plurality of measuring channels each described above, and measures the electrical characteristics of plural chips using the one set of measuring channels.

As shown in FIG. 6, the above-mentioned probe card of a multi-type has four measuring channels (CH1 to CH4) for example. Each of the measuring channels is provided with a large number of probes which are made come in contact with the respective electrodes of the associated one chip out of a plurality of chips formed on the semiconductor wafer. Then, the electrical signal of each of the chips, which has been obtained from each of the measuring channels (CH1 to CH4) is outputted to a tester 11. Each of the testers inspects, on the basis of the signal, to see whether each chip is a non-defective or a defective.

Then, the probe card of a multi-type is moved successively on the semiconductor wafer in such a way that the prior set of chips formed on the semiconductor wafer do not overlap with the posterior set of chips formed thereon. Whenever the probe card of a multi-type is moved, the probing is carried out in the resultant position.

The probe is moved along a tapered face of the semiconductor wafer while being pressed against the tapered face. As a result, there is a problem that the probe is deformed indicated by a solid line.

BRIEF SUMMARY OF THE INVENTION

The present invention was made in order to solve the above-mentioned problems associated with the prior art, and it is therefore an object of the present invention to provide an optimal probing mode setting method wherein a probe card is successively moved in a mode in which all the channels of one set of measuring channels are necessarily located in the positions where the respective chips will be measured, whereby any one probe can be prevented from being damaged.

The present invention relates to a method wherein a probe card of a multi-type having a large number of probes and including one set of measuring channels having a plurality of measuring channels each used to obtain the electrical signal of one chip formed on a semiconductor wafer is moved on the semiconductor wafer in order to inspect the electrical characteristics of each of the chips.

Particularly, the present invention is a probing method, utilizing an optimal probing mode, which may provide that the probe card is successively : moved in a mode in which all the channels of the one set of measuring channels are necessarily located in the positions where the respective chips will be measured.

The present invention provides, in the probing method utilizing the optimal probing mode, that with respect to the chip which probes have made come in contact with only once, the chip of interest is inspected by the contact, while with respect to the chip which probes have made come in contact with over plural times, the chip of interest is inspected by one of these plural contacts.

The present invention also provides, in the probing method utilizing the optimal probing mode, that with respect to the chip which probes have made come in contact with only once, the chip of interest is inspected by the contact, while with respect to the chip which probes have made come in contact with over plural times, the chip of interest is inspected by the final one of these plural contacts.

The present invention also provides disclosed in claim 4 may provide, in the probing method utilizing the optimal probing mode, that a plurality of chips formed on the semiconductor wafer are inspected at the same time with a plurality of chips, which are arranged linearly in the direction of 45 degrees, as one set.

The present invention also provides, in the probing method utilizing the optimal probing mode, that with respect to one specific channel out of the one set of measuring channels provided in the probe card, the positions to which it is to be successively moved on the semiconductor wafer are instructed, thereby setting the positions to which the probe card is to be moved in the above-mentioned mode.

Another embodiment of the present relates in general to an apparatus for carrying out the probing method utilizing the optimal probing mode previously disclosed, and more particularly to a probing apparatus including: a probe card of a multi-type having a large number of probes and also including one set of measuring channels having a plurality of measuring channels each used to obtain the electrical signal of one chip formed on a semiconductor wafer; means for instructing the positions to which the probe card is to be successively moved; means for moving successively the probe card on the semiconductor wafer on the basis of the instruction issued from the position instructing means; means for transmitting the information of the position of the chip which is inspected among the chips which has been contacted by the probe card; and a tester for inspecting the chips on the basis of the information which have been transmitted from the transmission means.

One embodiment of the present invention provides that the position instructing means in the probing apparatus is means for instructing the positions to which the probe card is to be successively moved in a mode in which all the channels of the one set of the measuring channels of the probe card are necessarily located in the positions where the respective chips will be measured thereby.

Another embodiment of the present invention provides that the transmission means in the probing apparatus is means for transmitting, with respect to the chip which probes have made come in contact with only once, the information to practice the inspection by the contact and transmitting, with respect to the chip which probes have made come in contact with over plural times, the information to practice the inspection by one of these plural contacts.

Another embodiment of the invention provides that the transmission means in the probing apparatus is means for transmitting, with respect to the chip which probes have made come in contact with only once, the information to practice the inspection by contact and transmitting, with respect to the chip which probes have made come in contact with over plural times, the information to practice the inspection by the final one of these plural contacts.

Another embodiment of the present invention provides that the probe card in the probing apparatus has one set of measuring channels in which the measuring channels are arranged linearly in the direction of 45 degrees.

Another embodiment of the present invention provides that the position instructing means in the probing apparatus is means for instructing, with respect to the one specific channel out of the one set of measuring channels provided on the probe card, the positions to which it is to be successively moved on the semiconductor wafer, thereby moving successively the probe card.

Another embodiment of the present invention provides that the position instructing means in the probing apparatus includes storage means for receiving and storing therein the information specifying the instructed positions.

Another embodiment of the present invention provides that the transmission means in the probing apparatus includes storage means for forming by internal arithmetic and storing therein the information specifying, which chip is practiced the inspection when probers contact chips at the instruction position.

Another embodiment of the present invention provides that the transmission means in the probing apparatus includes both storage means for forming and storing therein the information specifying the instructed positions, and storage means for forming by internal arithmetic and storing therein the information specifying, which chip is practiced the inspection when probers contact chips at the instructed position. The two storage means may be either different memories or one memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings are drawn in conjunction with a part of the specification and constitute a part thereof, and illustrate the preferred embodiment of the present invention. Also, these drawings contribute to the description of the present invention on the basis of both the general description mentioned above and the detailed description of the preferred embodiment as will be hereinafter be described, wherein:

FIG. 3 is a table useful in explaining the user input information;

DETAILED DESCRIPTION OF THE INVENTION

Conventionally, the probe card of a multi-type is successively moved on a semiconductor wafer having a large number of chips in such a way that the prior set of chips formed on the semiconductor wafer do not overlap with the posterior set of chips formed thereon. Then, whenever the probe card of a multi-type is moved, the probing is carried out for a plurality of chips using one set of measuring channels.

Figure 6:
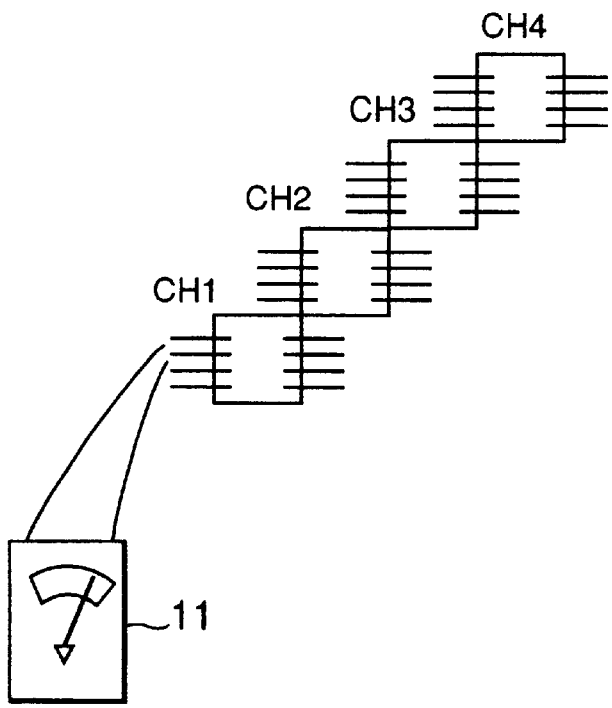
FIG. 6 is a schematic view showing a structure of a probe card of a multi-type used according to an embodiment of the present invention.

Therefore, whenever the inspection has been completed for one set of chips, e.g., four chips in the case of the probe card of a multi-type shown in FIG. 6, the probe card is moved to the position on a next set of chips which are to be subsequently inspected.

Figure 4:
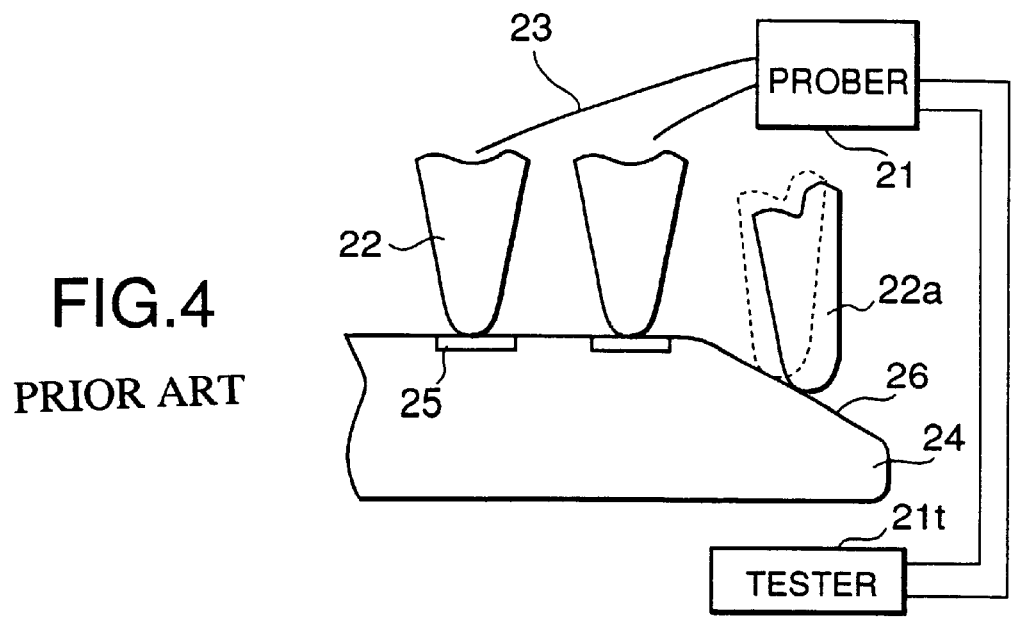
FIG. 4 is a schematic view useful in explaining the state of probes in a conventional prober.

In FIG. 4, reference numeral 21 designates a prober. Signal lines 23 are connected between the prober 21 and a plurality of probes 22 constituting the measuring channels. The probes 22 are made come in contact with electrode pads 25 of the respective chips formed on a semiconductor wafer 24 so that a predetermined inspection signal is applied from the probes to the respective electrode pads 25 in order to measure the electrical characteristics of the individual chips. Signals relating to the electrical characteristics obtained in the prober 21 are transmitted to a tester 21t. The tester 21t inspects to see whether each of the chips is a non-defective or a defective on the basis of the electrical characteristics. When the measuring channel provided in the probe card is located in the area, in the edge portion of the semiconductor wafer 24, in which no chip is formed, the probe 22a located on that area comes in contact with a tapered face 26 of the semiconductor wafer 24.

Figure 5:
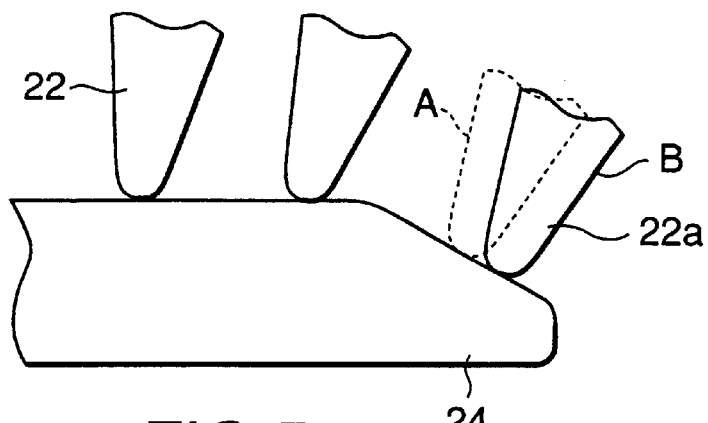
FIG. 5 is a schematic view useful in explaining the state of probes in a conventional prober.

In such a case, the probe 22a is moved along the tapered face 26 while being pressed against the tapered face. As a result, there is a problem that the probe 22a is deformed from a position A indicated by a broken line to a position B indicated by a solid line as shown in FIG. 5.

Mode of Implementing the Present Invention

The preferred embodiment of the present invention will hereinafter be described in detail with reference to the accompanying drawings.

Figure 1:
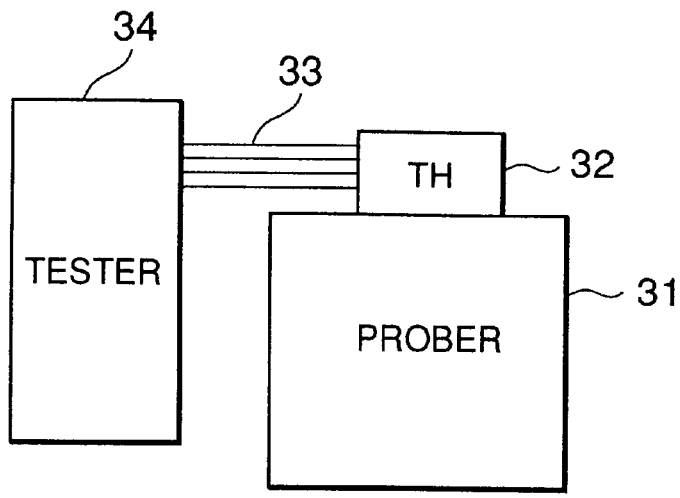
FIG. 1 is a block diagram showing a schematic configuration of a prober according to an embodiment of the present invention.

Referring first to FIG. 1, reference numeral 31 designates a prober. The prober 31 includes, for example, a probe card of a multi-type as shown in FIG. 6, and a test head (TH) 32. A tester 34 is connected to the test head (TH) 32 through signal lines 33 as transmission means for transmitting therethrough the data of the electrical characteristics of chips which have been measured by the probe card. The prober 31 includes means for instructing the positions to which the probe card is to be successively moved in a mode in which all the channels in the measuring channels of the probe card are necessarily located in the positions where the respective chips will be measured.

Storage means (memory) is provided in the inside of the prober 31. User input information is inputted to and stored in the memory. In the prober 31, the information relating to the positions to which the probe card is to be successively moved on the semiconductor wafer is transmitted to the means for moving the probe card on the basis of the user input information thus transmitted thereto.

Next, the description will hereinbelow be given with respect to an example of the user input information with reference to FIGS. 2 and 3.

Figure 2:
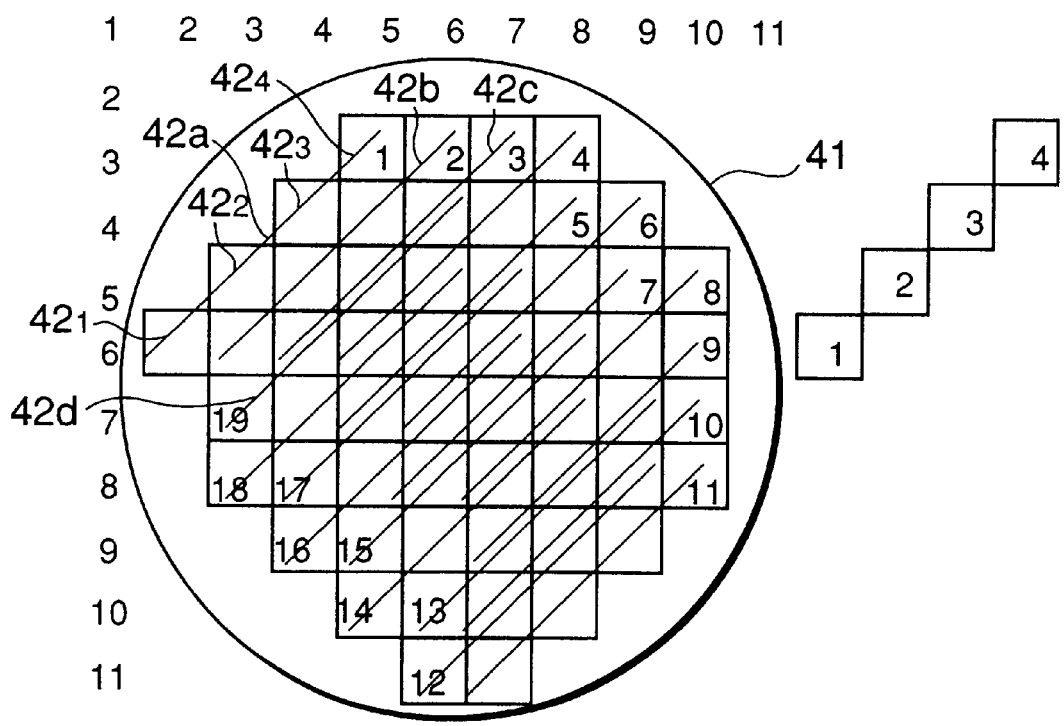
FIG. 2 is a plan view showing the state of areas to be inspected according to the embodiment.

As shown in FIG. 2, a plurality of chips which have been obtained after the predetermined manufacturing processes are formed in a matrix on the semiconductor wafer 41. As for the coordinate system for specifying the positions of the chips, the coordinates denoted by 1, 2, . . . , 11 are illustrated vertically as the Y-axis and the coordinates denoted by 1, 2, . . . , 11 are illustrated horizontally as the X-axis.

The straight line designated by reference numeral 42a shows the probe card of a multi-type (refer to FIG. 6) having four measuring channels. This probe card can measure simultaneously the four chips which are arranged in the direction of 45 degrees. In other words, the probe card 42a has the four heads for CH1 to CH4 ($42_1$ to $42_4$).

In FIG. 3, "the coordinates of the channel 1" shows the coordinates (Xn, Yn) of the measuring channel 1 of the probe card 42a. When the step number is 1, it is represented that the measuring channel 1 of the probe card 42 corresponds to the coordinates (2, 6). "On-wafer information" shows a channel or channels to practice the inspection and a channel or channels not to practice the inspection among the four measuring channels. In this connection, the case of "1" corresponds to "ON", while the case of "0" corresponds to "OFF". In other words, the indication of "1" means that the electrical signal which have been obtained through the probe is inspected by the tester side, while the indication of "0" means that the electrical signal which have been obtained through the probe is not inspected by the tester side. For example, in the case where the step number is 1, it is shown that the electrical signals which have been obtained through the measuring channels 2, 3 and 4 are inspected by the tester side, while the electrical signal which have been obtained through the measuring channel 1 is not inspected by the tester side.

In the user input information shown in FIG. 3, in the case where the step number is 1, the coordinates (Xn, Yn) of the head of the channel 1 of the probe card 42 are (2, 6). Since CH1=0, and CH2=CH3=CH4=1 are established, it is shown that the signal obtained through CH1 is not inspected by the tester side, but the signals obtained through CH2 to CH4 are inspected by the tester side. The reason for CH1=0 is that since the chip which has been measured through CH1 is located in the end portion, the possibility that the chip of interest is a defective is high.

In the case where the step number is 2, since the coordinates (Xn, Yn) of the head of the channel 1 of the probe card 42 are (3, 6), the probe card 42 is represented by the straight line 42b in FIG. 2. Since CH1=CH2=CH3=CH4=1 is established, it is shown that all the electrical signal obtained through CH1 to CH4 are inspected by the tester side.

In the case where the step number is 3, since the coordinates (Xn, Yn) of the head of the channel 1 of the probe card 42 are (4, 6), the probe card 42 is represented by the straight line 42c in FIG. 2. Since CH1=CH2=CH3=0 and CH4=1 are established, it is shown that only the electrical signal obtained through CH4 is inspected by the tester side.

In the case where the step number is 4, since the coordinates (Xn, Yn) of the head of the channel 1 of the probe card 42 are (5, 6), and also CH1=CH2=0 and CH3=CH4=1 are established, it is shown that only the electrical signals obtained through CH3 and CH4 are inspected by to the tester side.

In the case where the step number is 5, since the coordinates (Xn, Yn) of the head of the channel 1 of the probe card 42 are (5, 7), and also CH1=CH2=CH3=0 and CH4=1 are established, it is shown that only the electrical signal obtained through CH4 is inspected by the tester side.

In the case where the step number is 6, since the coordinates (Xn, Yn) of the head of the channel 1 of the probe card 42 are (6, 7), and also CH1=CH2=0 and CH3=CH4=1 are established, it is shown that only the electrical signals obtained through CH3 and CH4 are inspected by the tester side.

Further, in the case where the step number is 7, since the coordinates (Xn, Yn) of the head of the channel 1 of the probe card 42 are (6, 8), and also CH1=CH2=CH3=0 and CH4=1 are established, it is shown that only the electrical signal obtained through CH4 is inspected by the tester side.

In the column of "coordinates of channel 1", in the user input information shown in FIG. 3, the movement position of the probe card of a multi-type is instructed in such a way that the probe card is successively moved in a mode in which all the channels of one set of measuring channels are necessarily located in the positions where the respective chips will be measured. When the probe card is successively moved in such a mode, for example, in FIG. 2, with respect to the chips which are inspected in the position 42c by the probe card 42, and the chips which are inspected in the position 42d by the probe card 42, the inspection is carried out with their parts overlapping with each other.

In such a case, "1" and "0" are set in the column of "on-wafer information" in such a way that with respect to the chip which does not overlap with any other chip in the inspection, i.e., the chip which probes have made come in contact with only once, the chip of interest is inspected by the contact, while with respect to the chip which probes have made come in contact with over plural times, the chip of interest is inspected by one of these plural contacts.

In each of the above-mentioned steps, by adopting the mode in which all the channels in one set of measuring channels are necessarily located in the positions where the respective chips will be measured, i.e., the mode in which the probe is moved only within the area, on the semiconductor wafer, in which the chips are formed, it is possible to prevent that the probe of the probe card of a multi-type is made enter into the tapered face in the end portion of the semiconductor wafer to be damaged.

With respect to the chip which probes have made come in contact with over plural times, only one of these plural contacts practice the inspection whereby the duplicated inspection is avoided. In addition, it is preferable that the inspection is practiced by the final contact as "one of the plural contacts". This reason is that the inspection result by the final one of the plural contacts exhibits the newest inspection result.

According to the present invention, since the area to be inspected by the probe card is repeatedly measured, it is possible to reduce the area in which the probe card is moved.

It should be noted that other features and changes are readily understood by the person skilled in the art. Therefore, the present invention stands on the wider viewpoint and hence is not limited to the specific detailed and typical embodiment described herein. Accordingly, various modifications may be made without departing from the wide concept of the invention defined in the appended claims, and interpretation and scope of equivalents.

What is claimed is:

1. A probing method utilizing an optimal probing mode, comprising the steps of:

moving successively a probe card having a plurality of probes constituting a set of measuring channels used to obtain electrical signals from a plurality of chips formed on a semiconductor wafer, in which each of the plurality of probes is necessarily in contact with a chip, and wherein each of the plurality of probes of each measuring channels is in contact with a different chip on said semiconductor wafer; and inspecting the plurality of chips formed on said semiconductor wafer, to which said probe card is successively moved, wherein each of said plurality of probes is in contact with a chip on said semiconductor wafer during the inspection, wherein each of said plurality of chips is inspected only once, and with respect to a first chip that has been contacted only once, the first chip is inspected during the one contact, and with respect to a second chip that has been contacted multiple times, the second chip is inspected during only one of the multiple contacts.

2. The probing method utilizing an optimal probing mode according to claim 1, wherein said one of the multiple contacts during which the second chip is inspected is the final one of the multiple contacts.

3. The probing method utilizing an optimal probing mode according to claim 1, wherein said one set of measuring channels inspect the plurality of chips, which are arranged linearly in the direction of 45 degrees, concurrently as one set.

4. The probing method utilizing an optimal probing mode according to claim 1, wherein with respect to one specific channel out of said one set of measuring channels provided in said probe card, the positions to which it is to be successively moved on said semiconductor wafer, thereby setting said mode.

5. A probing apparatus utilizing an optimal probing mode, comprising:

a probe card having a plurality of probes and including one set of measuring channels used to obtain electrical signals from a plurality of chips formed on a semiconductor wafer;

means for instructing positions, to which said probe card is to be successively moved, in a mode in which each of said plurality of probes is necessarily in contact with respective ones of sad plurality of chips;

means for moving successively said probe card on said semiconductor wafer on the basis of the instruction issued from said position instructing means;

means for transmitting a signal containing information of a position of a chip which is to be inspected among the plurality of chips contacted by said probe card; and a tester for inspecting the chip on the basis of the information which has been transmitted from said transmission means thereto, wherein with respect to a first chip that has been contacted only once by said probe card, said transmission means transmits the information signal during the contact, and with respect to a second chip that has been contacted multiple times by said probe card, said transmission means transmits the information signal during only one of the multiple contacts.

6. The probing apparatus utilizing an optimal probing mode according to claim 5, wherein said one of the multiple contacts during which the transmission means transits the information signal is the final one of the multiple contacts.

7. The probing apparatus utilizing an optimal probing mode according to claim 5, wherein said probe card has one set of measuring channels in which the measuring channels are arranged linearly in the direction of 45 degrees.

8. The probing apparatus utilizing an optimal probing mode according to claim 5, wherein said position instructing means is means for instructing, with respect to one specific channel out of said one set of measuring channels provided in said probe card, a next position to which said probe card is to be successively moved on said semiconductor wafer.

9. The probing apparatus utilizing an optimal probing mode according to claim 5, further comprising:

storage means for receiving and storing therein information specifying the positions to be instructed.

10. The probing apparatus utilizing an optimal probing mode according to claim 5, further comprising:

storage means for forming by internal arithmetic and storing therein information specifying which chip has been inspected at the instructed position.

11. The probing apparatus utilizing an optimal probing mode according to claim,further comprising:

first storage means for forming and storing therein information specifying the position to be instructed; and second storage means for forming by internal arithmetic and storing therein information specifying which chip is to be inspected.

* * * * *

UNITED STATES PATENT AND TRADEMARK OFFICE
CERTIFICATE OF CORRECTION

PATENT NO. : 6,262,586 B1
DATED : July 17, 2001
INVENTOR(S) : Yukihiko Fukasawa

It is certified that error appears in the above-identified patent and that said Letters Patent is hereby corrected as shown below:

<u>Title page,</u>
Item [75], Inventor, Yukihilo Fukasawa, Norasaki (JP)

Signed and Sealed this

Nineteenth Day of March, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO.    : 6,262,586 B1  Page 1 of 1
DATED         : July 17, 2001
INVENTOR(S)   : Yukihiko Fukasawa It is certified that error appears in the above-identified patent and that said Letters Patent is hereby corrected as shown below:

<u>Title page,</u>
Item [75], Inventor, Yukihiko Fukasawa, Norasaki (JP)

This certificate supersedes Certificate of Correction issued March 19, 2002

Signed and Sealed this

Eighth Day of October, 2002

*Attest:*

JAMES E. ROGAN
*Attesting Officer*    *Director of the United States Patent and Trademark Office*